(12) United States Patent
Kim et al.

(10) Patent No.: US 10,672,844 B2
(45) Date of Patent: Jun. 2, 2020

(54) ORGANIC LIGHT EMITTING DIODE DISPLAY

(71) Applicant: SAMSUNG DISPLAY CO., LTD., Yongin-si, Gyeonggi-do (KR)

(72) Inventors: Jung Hwa Kim, Gunpo-si (KR); Moo Soon Ko, Seoul (KR); Se Wan Son, Yongin-si (KR); Jin Sung An, Seongnam-si (KR); Wang Woo Lee, Osan-si (KR); Ji Seon Lee, Seoul (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 15/865,685

(22) Filed: Jan. 9, 2018

(65) Prior Publication Data
US 2018/0308912 A1    Oct. 25, 2018

(30) Foreign Application Priority Data

Apr. 21, 2017    (KR) .................. 10-2017-0051880

(51) Int. Cl.
| | | |
|---|---|---|
| *H01L 27/32* | (2006.01) | |
| *H01L 51/52* | (2006.01) | |
| *H01L 51/50* | (2006.01) | |
| *G09G 3/3258* | (2016.01) | |
| *G09G 3/3225* | (2016.01) | |

(52) U.S. Cl.
CPC ....... *H01L 27/3246* (2013.01); *G09G 3/3225* (2013.01); *G09G 3/3258* (2013.01); *H01L 27/3223* (2013.01); *H01L 27/3276* (2013.01); *H01L 51/5044* (2013.01); *H01L 51/5203* (2013.01); *H01L 51/5206* (2013.01); *H01L 51/5237* (2013.01); *G09G 2300/0413* (2013.01); *G09G 2310/0264* (2013.01)

(58) Field of Classification Search
CPC ............ H01L 27/3211; H01L 27/3223; H01L 27/3276; H01L 51/5044; H01L 51/5203; H01L 51/5206; H01L 51/5237
See application file for complete search history.

(56) References Cited

U.S. PATENT DOCUMENTS

| | | | |
|---|---|---|---|
| 9,490,305 B2 | 11/2016 | Lee et al. | |
| 2005/0243044 A1* | 11/2005 | Kang | ................ G02F 1/136286 345/87 |
| 2016/0021773 A1* | 1/2016 | Yun | ......................... H05K 7/02 361/752 |
| 2016/0321993 A1* | 11/2016 | Choi | ................... H01L 27/3223 |

FOREIGN PATENT DOCUMENTS

| | | |
|---|---|---|
| KR | 1020160080873 | 7/2016 |
| KR | 101654762 | 8/2016 |
| KR | 1020160119710 | 10/2016 |
| KR | 1020160141272 | 12/2016 |

* cited by examiner

*Primary Examiner* — Cuong Q Nguyen
(74) *Attorney, Agent, or Firm* — F. Chau & Associates, LLC

(57) ABSTRACT

An organic light emitting diode display includes a substrate, a first electrode, a second electrode, an organic emission layer positioned between the first electrode and the second electrode, a driving voltage line, a dummy electrode. The dummy electrode is positioned at the same layer as the first electrode.

13 Claims, 8 Drawing Sheets

ORGANIC LIGHT EMITTING DIODE DISPLAY

CROSS-REFERENCE TO RELATED APPLICATION

This application claims priority under 35 USC § 119 to Korean Patent Application No. 10-2017-0051880, filed on Apr. 21, 2017, in the Korean Intellectual Property Office, the disclosure of which is incorporated by reference herein in its entirety.

TECHNICAL FIELD

Example embodiments of the present inventive concept relate generally to an organic light emitting diode display.

DISCUSSION OF THE RELATED ART

An organic light emitting diode (OLED) display may include two electrodes and an organic emission layer interposed therebetween. For example, electrons injected from one electrode and holes injected from the other electrode may be combined in the organic emission layer to generate excitons. The generated excitons may be changed to a ground state from an exited state, releasing energy to emit light.

An organic light emitting diode display may include a plurality of pixels. The plurality of pixels including an organic light emitting diode as a self-emissive element, and a plurality of transistors for driving the organic light emitting diode and at least one capacitor may be formed in each pixel. The plurality of transistors may generally include a switching transistor and a driving transistor. The organic light emitting diode may include a first electrode and a second electrode overlapping each other and an organic emission layer positioned therebetween. The organic light emitting diode display may include a display area displaying a screen and a driving circuit area attached to a driving circuit chip. In the display area, a plurality of pixel electrodes may be disposed with a predetermined interval. The pixel electrode may not be positioned in the driving circuit area, or the region between the display area and the driving circuit area. Accordingly, in a process of performing exposure and development after coating a photoresist for patterning the pixel electrode, the photoresist positioned at an edge of the display area may only be partially developed due to a rapid change in density. Accordingly, adjacent pixel electrodes positioned at the edge of the display area may be short-circuited to each other.

SUMMARY

According to an exemplary embodiment of the present inventive concept, an organic light emitting diode display includes a substrate including a display area, a driving circuit area, and a dummy region positioned between the display area and the driving circuit area. The organic light emitting diode display further includes a first electrode positioned in the display area, a second electrode overlapping the first electrode, an organic emission layer positioned between the first electrode and the second electrode, and a driving voltage line positioned in the display area and the dummy region. The organic light emitting diode display still further includes a dummy electrode positioned in the dummy region and connected to the driving voltage line. The dummy electrode is positioned at the same layer as the first electrode.

According to an exemplary embodiment of the present inventive concept, a method of manufacturing an organic light emitting diode display includes having a substrate including a display area, a driving circuit area, and a dummy region positioned between the display area and the driving circuit area. The method further includes forming a thin film transistor on the substrate, forming a first electrode on the display area, forming an organic emission layer on the first electrode, forming a pixel definition layer to cover at least a portion of the first electrode and forming a second electrode on the organic emission layer and the pixel definition layer. The method still further includes, forming a driving voltage line in the display area and the dummy region. The method still includes forming a dummy electrode in the dummy region and connecting to the driving voltage line. The dummy electrode is positioned at the same layer as the first electrode.

BRIEF DESCRIPTION OF THE DRAWINGS

The above and other features of the inventive concept will become more apparent by describing in detail exemplary embodiments thereof, with reference to the accompanying drawing, which.

DETAILED DESCRIPTION

Exemplary embodiments of the present inventive concept will be described more fully hereinafter with reference to the accompanying drawings. The present disclosure may, however, be embodied in many different forms and should not be construed as limited to the embodiments set forth herein.

It will be understood that when an element is referred to as being "connected" or "coupled" to another element, it can be directly connected or coupled to the other element or intervening elements may be present.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" means positioning on or below the object portion, but does not essentially mean positioning on the upper side of the object portion based on a gravity direction.

An organic light emitting diode display according to an exemplary embodiment of the present inventive concept may be described with reference to FIG. 1.

Figure 1:
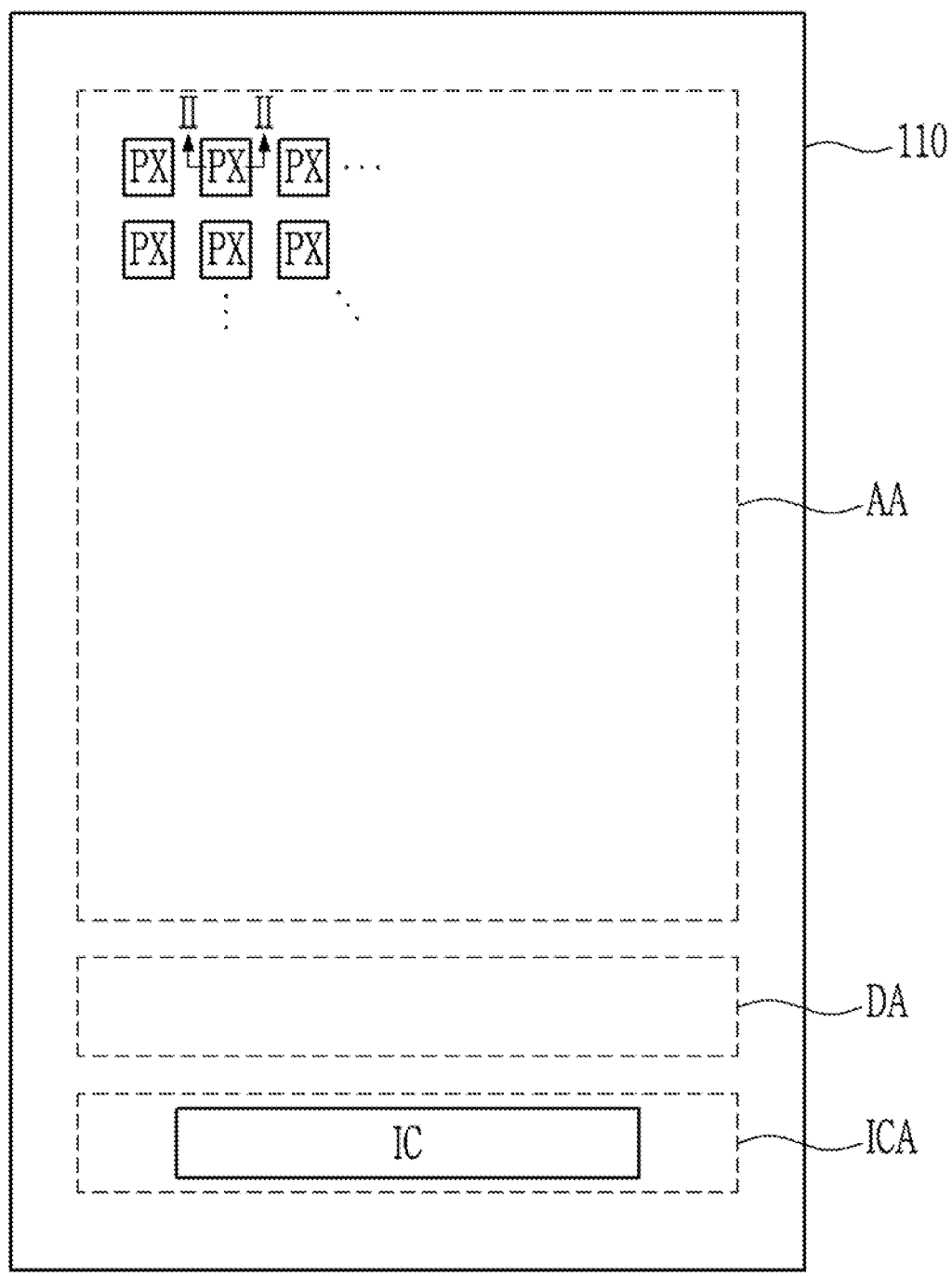
FIG. 1 is a layout view of an organic light emitting diode display according to an exemplary embodiment of the present inventive concept.

FIG. 1 is a layout view of an organic light emitting diode display according to an exemplary embodiment of the present inventive concept.

As shown in FIG. 1, the organic light emitting diode display according to an exemplary embodiment may include a substrate 110 having a display area AA, a driving circuit area ICA, and a dummy area DA.

The display area AA may be a region displaying the image, and may be positioned, for example, at a center of the substrate 110. A plurality of pixels PX may be positioned in the display area AA.

Although not shown, in the display area AA, a plurality of gate lines, a plurality of data lines, and a plurality of driving voltage lines may be positioned, and each pixel PX may be connected to each of the plurality of gate lines, each of the plurality of data lines, and each of the plurality of driving voltage lines.

The driving circuit area ICA may be a region where a driving circuit IC supplying a predetermined signal to the display area AA is positioned. The driving circuit area ICA may be positioned outside the display area AA. In one example, the driving circuit area ICA may be positioned at a lower portion of the substrate 110 when viewed in the front view. The driving circuit IC may be made, for example, as a chip type to be attached on the substrate 110. On the other hand, the present invention is not limited thereto, and the driving circuit IC may be formed in a flexible printed circuit board (FPCB) to be attached to the substrate 110. In one example, the driving circuit IC may generate a predetermined signal to be supplied to the each of the plurality of gate line, the data lines, and the driving voltage lines.

In one example, the dummy area DA may be positioned between the display area AA and the driving circuit area ICA. The plurality of data lines, the plurality of driving voltage lines or the like may pass through the dummy area DA.

The display area AA of the organic light emitting diode display according to an exemplary embodiment will be described with reference to FIG. 2.

Figure 2:
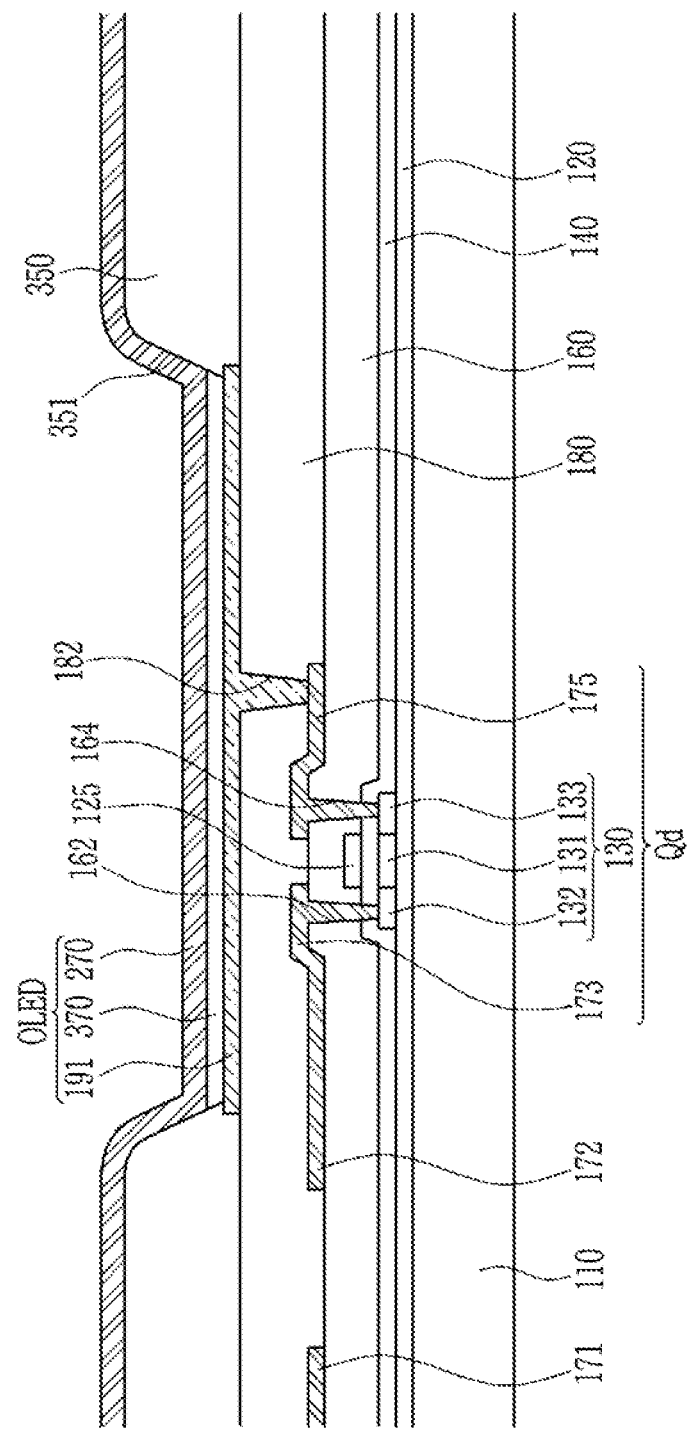
FIG. 2 is a cross-sectional view taken along a line II-II of FIG. 1, and shows a display area of an organic light emitting diode display according to an exemplary embodiment of the present inventive concept.

FIG. 2 is a cross-sectional view showing a display area of an organic light emitting diode display according to an exemplary embodiment of the present inventive concept.

As shown in FIG. 2, the organic light emitting diode display according to an exemplary embodiment may include the substrate 110, a thin film transistor Qd positioned on the substrate 110, a pixel electrode 191 connected to the thin film transistor Qd, an organic emission layer 370 positioned on the pixel electrode 191, and a common electrode 270 positioned on the organic emission layer 370.

The substrate 110 may be an insulating substrate, and may include glass, quartz, ceramic, plastic, a metal substrate made of stainless steel or the like. In one embodiment, the substrate 10 may be flexible, stretchable, foldable, bendable, or rollable. In one embodiment, the substrate 110 may be flexible, stretchable, foldable, bendable, or rollable, and the entire organic light emitting diode display may be flexible, stretchable, foldable, bendable, or rollable.

A buffer layer 120 may be further positioned on the substrate 110. The buffer layer 120 may have may include a single layer made of, for example, a silicon nitride (SiNx), or a double-layered structure in which, for example, the silicon nitride (SiNx) and a silicon oxide (SiOx) may be laminated. The buffer layer 120 may serve to planarize a surface of the substrate 110 while preventing undesirable materials, for example, impurities or moisture, from permeating. In one embodiment, the buffer layer 120 may be omitted.

A semiconductor 130 may be positioned on the buffer layer 120. The semiconductor 130 may include a polycrystalline semiconductor material or an oxide semiconductor material. The semiconductor 130 may include a channel region 131 in which no impurities may be doped, and contact doping regions 132, 133 in which impurities may be doped at opposite sides of the channel region 131. In one example, the contact doping regions 132, 133 may include a source region 132 and a drain region 133, respectively. In another example, the contact doping regions 132, 133 may include the drain region 133 and the source region 132, respectively. The impurity may be changed depending on a type of the thin film transistor. For example, the contact doping regions 132, 133 may include p-type dopants or n-type dopant depending on the type of the thin film transistor.

A gate insulating layer 140 may be positioned on the semiconductor 130. The gate insulating layer 140 may include an inorganic insulating material, for example, the silicon nitride (SiNx) or the silicon oxide (SiOx).

A gate electrode 125 may be positioned on the gate insulating layer 140. The gate electrode 125 may overlap at least part of the semiconductor 130. In one example, the gate electrode 125 may overlap the channel region 131 when viewed from a direction perpendicular to the surface of the substrate 110. A predetermined gate voltage may be applied to the gate electrode 125.

An interlayer insulating layer 160 may be positioned on the gate electrode 125 and the gate insulating layer 140. In one embodiment, the interlayer insulating layer 160 may include the inorganic insulating material or the organic insulating material.

The gate insulating layer 140 and the interlayer insulating layer 160 may include contact holes 162, 164 overlapping at least part of the semiconductor 130. For example, the contact holes 162, 164 may overlap the contact doping regions 132, 133 of the semiconductor 130, respectively when viewed from the direction perpendicular to the surface of the substrate 110.

A data line 171, a driving voltage line 172, a source electrode 173, and a drain electrode 175 may be positioned on the interlayer insulating layer 160. A predetermined data signal may be applied to the data line 171. The source electrode 173 may be connected to the driving voltage line 172, and may receive a predetermined driving voltage through the driving voltage line 172. The source electrode 173 and the drain electrode 175 may be respectively connected to the source region 132 and the drain region 133 of the semiconductor 130 through the contact holes 162 and 164.

As described above, the semiconductor 130, the gate electrode 125, the source electrode 173, and the drain electrode 175 may form the thin film transistor Qd. On the other hand, the configuration of the thin film transistor Qd is not limited to the aforementioned example, and may be variously modified as a known configuration which may be easily implemented by those skilled in the art.

The organic light emitting diode display may include a switching transistor and a driving transistor, and the aforementioned thin film transistor may be the driving transistor. Although not shown, the switching thin film transistor may be further formed. In one embodiment, the switching thin film transistor may include a switching semiconductor, a switching gate electrode, a switching source electrode, and a switching drain electrode.

A passivation layer 180 may be positioned on the thin film transistor Qd and the interlayer insulating layer 160. The passivation layer 180 may remove any step or unevenness of the underlying layers for planarization, thereby increasing luminous efficiency of the OLED to be formed thereon. In one example, a contact hole 182 overlapping at least some of the drain electrode 175 may be formed in the passivation layer 180.

The passivation layer 180 may include a polyacrylate resin, an epoxy resin, a phenolic resin, a polyamide resin, a polyimide resin, an unsaturated polyester resin, a polyphenylene resin, a polyphenylene sulfide resin, and benzocyclobutene (BCB).

The pixel electrode 191 may be positioned on the passivation layer 180. The pixel electrode 191 may include a transparent conductive material, for example, indium tin oxide (ITO), indium zinc oxide (IZO), zinc oxide (ZnO), indium oxide ($In_2O_3$), a reflective metal, for example, lithium (Li), calcium (Ca), lithium fluoride/calcium (LiF/Ca), lithium fluoride/aluminum (LiF/Al), aluminum (Al), silver (Ag), magnesium (Mg), gold (Au), or the like. The pixel electrode 191 may be electrically connected to the drain electrode 175 of the thin film transistor (Qd) through the contact hole 182 provided in the passivation layer 180 to be an anode of the organic light emitting diode (OLED).

Although not illustrated, the pixel electrode 191 may include first and second transparent electrodes including the transparent conductive material, and a semi-transmissive layer positioned between the first and second transparent electrodes to form a microcavity together with a common electrode 270. For example, the pixel electrode 191 may be formed as a multilayer including a layer including the transparent conductive material and a layer including a reflective metal material.

A pixel definition layer 350 may be positioned on the passivation layer 180 and on an edge of the pixel electrode 191. In one embodiment, the pixel definition layer 350 may be formed of a shape enclosing the edge of the pixel electrode 191. For example, the pixel definition layer 350 may overlap the edge of the pixel electrode 191 as shown in FIG. 2. The pixel definition layer 350 may include a pixel opening 351 exposing the pixel electrode 191. The pixel definition layer 350 may include a resin, for example, a polyacrylate resin and a polyimide resin, or a silica-based inorganic material.

An organic emission layer 370 may be positioned in the pixel opening 351 of the pixel definition layer 350. The organic emission layer 370 may include at least one of an emission layer, a hole-injection layer (HIL), a hole-transporting layer (HTL), an electron-transporting layer (ETL), or an electron-injection layer (EIL).

The organic emission layer 370 may include a red organic emission layer which emits red light, a green organic emission layer which emits green light, and a blue organic emission layer which emits blue light. The red organic emission layer, the green organic emission layer, and the blue organic emission layer may be respectively formed in a red pixel, a green pixel, and a blue pixel to implement color images.

The organic emission layer 370 may also implement color images by stacking the red organic emission layer, the green organic emission layer, and the blue organic emission layer in all of the red pixel, the green pixel, and the blue pixel and respectively forming a red color filter, a green color filter, and a blue color filter for each pixel. Alternatively, a color image may be implemented by forming a white organic emission layer emitting white light on all of the red, green, and blue pixels and respectively forming red, green, and blue color filters for each pixel. In another embodiment, in case the color image is implemented by using the white organic emission layer and the color filter, a deposition mask for depositing the red, green, and blue organic emission layers on the corresponding red, green, and blue pixels may not be required.

The white organic emission layer described in another exemplary embodiment may be formed as a single organic emission layer, and may further include a structure for emitting white light by laminating a plurality of organic emission layers. For example, the structure for emitting white light by combining at least one yellow organic emission layer with at least one blue organic emission layer, a structure for emitting white light by combining at least one cyan organic emission layer with at least one red organic emission layer, and a structure for emitting white light by combining at least one magenta organic emission layer with at least one green organic emission layer may be included.

The common electrode 270 may be positioned on the pixel definition layer 350 and the organic emission layer 370. The common electrode 270 may overlap the pixel electrode 191 via the organic emission layer 370 interposed therebetween. In one embodiment, the common electrode 270 may overlap the edge of the pixel electrode 191 via the pixel definition layer 350 interposed therebetween when viewed from the direction perpendicular to the surface of the substrate.

The common electrode 270 may include the transparent conductive material, for example, the indium tin oxide (ITO), the indium zinc oxide (IZO), the zinc oxide (ZnO), the indium oxide ($In_2O_3$), the reflective metal, for example, lithium (Li), calcium (Ca), lithium fluoride/calcium (LiF/Al), lithium fluoride/aluminum (LiF/Al), aluminum (Ag), silver (Ag), magnesium (Mg), gold (Au), or the like. The common electrode 270 may be a cathode of the organic light emitting diode. In one embodiment, the organic light emitting diode may include the pixel electrode 191, the organic emission layer 370, and the common electrode 270.

The dummy region of the organic light emitting diode display according to an exemplary embodiment of the present inventive concept will be described with reference to FIG. 3 and FIG. 4.

Figure 3:
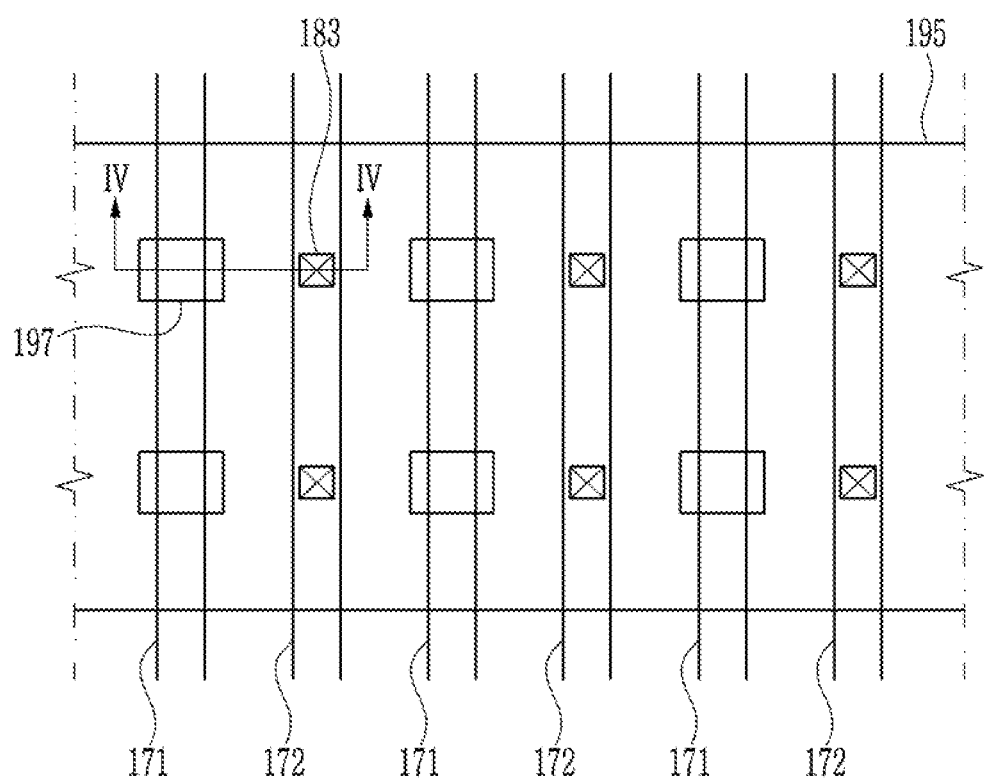
FIG. 3 is a top plan view showing a dummy region of an organic light emitting diode display according to an exemplary embodiment of the present inventive concept.
Figure 4:
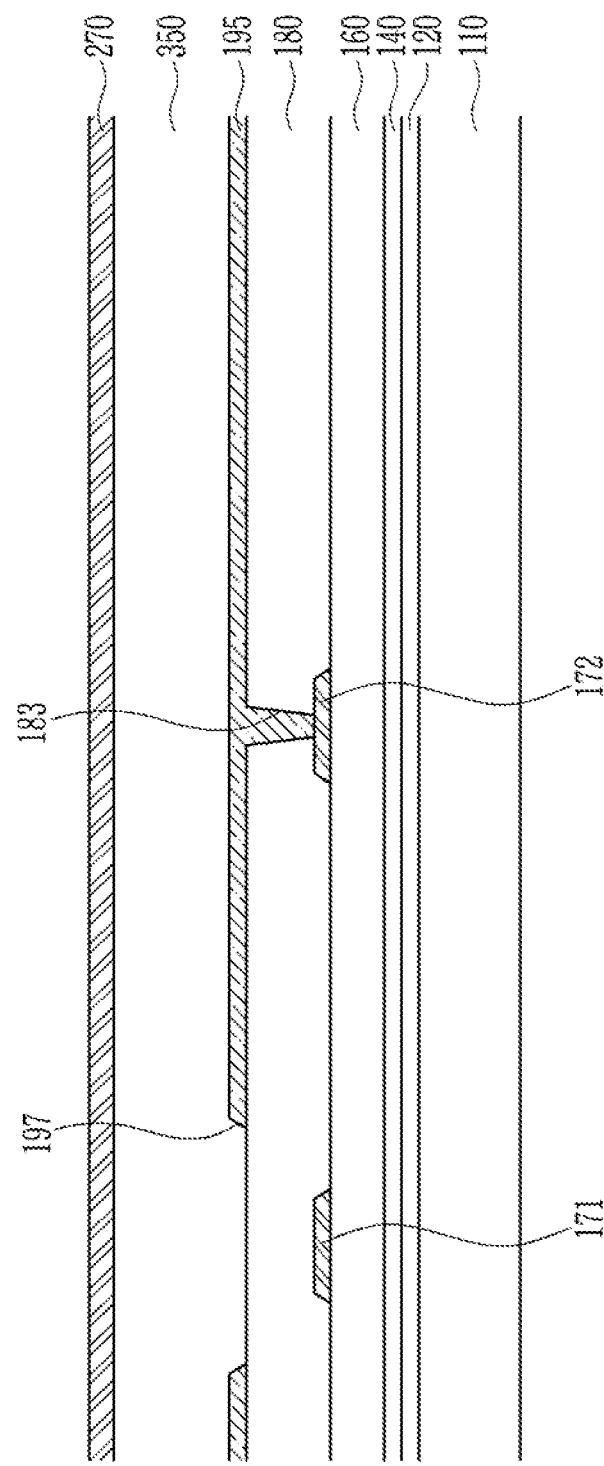
FIG. 4 is a cross-sectional view taken along a line IV-IV of FIG. 3.

FIG. 3 is a top plan view showing a dummy region of an organic light emitting diode display according to an exemplary embodiment, and FIG. 4 is a cross-sectional view taken along a line IV-IV of FIG. 3.

As shown in FIG. 3 and FIG. 4, in one example, the buffer layer 120, the gate insulating layer 140, and the interlayer insulating layer 160 may be sequentially deposited on the dummy area DA of the substrate 110.

The data lines 171 and the driving voltage lines 172 may be positioned on the interlayer insulating layer 160. In one embodiment, the plurality of data lines 171 and the plurality of driving voltage lines 172 may extend to be parallel to each other. As shown in the FIG. 3 and FIG. 4, the data lines 171 and the driving voltage lines 172 may be alternately arranged from each other. In another exemplary embodiment, two data lines 171 may be disposed between adjacent driving voltage lines 172.

The passivation layer 180 may be positioned on the interlayer insulating layer 160, the data lines 171, and the driving voltage lines 172. The passivation layer 180 may include a contact hole 183 overlapping at least part of the driving voltage line 172.

A dummy electrode 195 may be positioned on the passivation layer 180. The dummy electrode 195 may include the same material as the pixel electrode 191 positioned in the display area AA. In one embodiment, the dummy electrode 195 may be positioned at the same layer as the pixel electrode 191 and may be formed by the same process. In one embodiment, the dummy electrode 195 may be connected to the driving voltage line 172 through the contact hole 183. On the other hand, the present invention is not limited thereto, and the dummy electrode 195 may not be connected to the driving voltage line 172. For example, the dummy electrode 195 may be floated. In the present exemplary embodiment, the dummy electrode 195 may be connected to the driving voltage line 172, thereby receiving the predetermined driving voltage from the driving voltage line 172, which may prevent the organic light emitting diode display from being damaged by static electricity.

The dummy electrode 195 may include a plurality of openings 197. The plurality of openings 197 may be disposed in a matrix shape along a row direction and a column direction while having a predetermined interval. In one embodiment, the opening 197 may be made as an approximate quadrangle and may overlap the data line 171. On the other hand, the present invention is not limited thereto. For example, the shape of the opening 197 may be different from the approximate quadrangle and/or may not overlap the data line 171. In another example, the opening 197 may overlap the driving voltage line 172.

The data line 171 and the driving voltage line 172 may be positioned under the dummy electrode 195. On the other hand, the present invention is not limited thereto, and other wires or other patterns may be further positioned under the dummy electrode 195. In one embodiment, the wires or the patterns positioned under the dummy electrode 195 may be made of the same material as the semiconductor 130 or the gate electrode 125. In one embodiment, the wires or the patterns positioned under the dummy electrode 195 may be positioned at the same layer as the semiconductor 130 or the gate electrode 125, and may be formed by the same process.

The pixel definition layer 350 may be positioned on the dummy electrode 195, and the common electrode 270 may be positioned on the pixel definition layer 350. The common electrode 270 may overlap the dummy electrode 195 via the pixel definition layer 350 interposed therebetween when viewed from the direction perpendicular to the surface of the substrate.

Next, the organic light emitting diode display according to an exemplary embodiment will be described with reference to FIG. 5 and FIG. 6.

Figure 5:
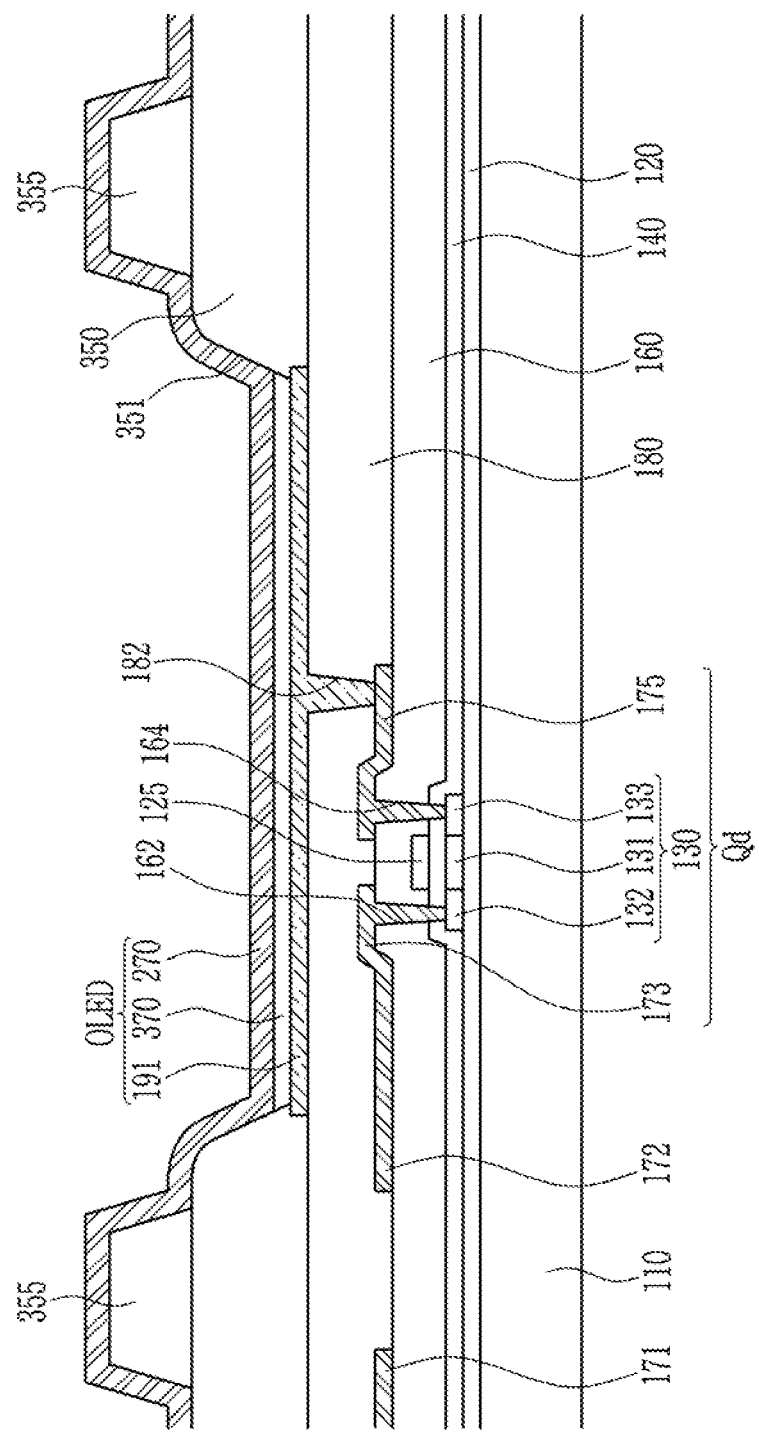
FIG. 5 is a cross-sectional view showing a display area of an organic light emitting diode display according to an exemplary embodiment of the present inventive concept.
Figure 6:
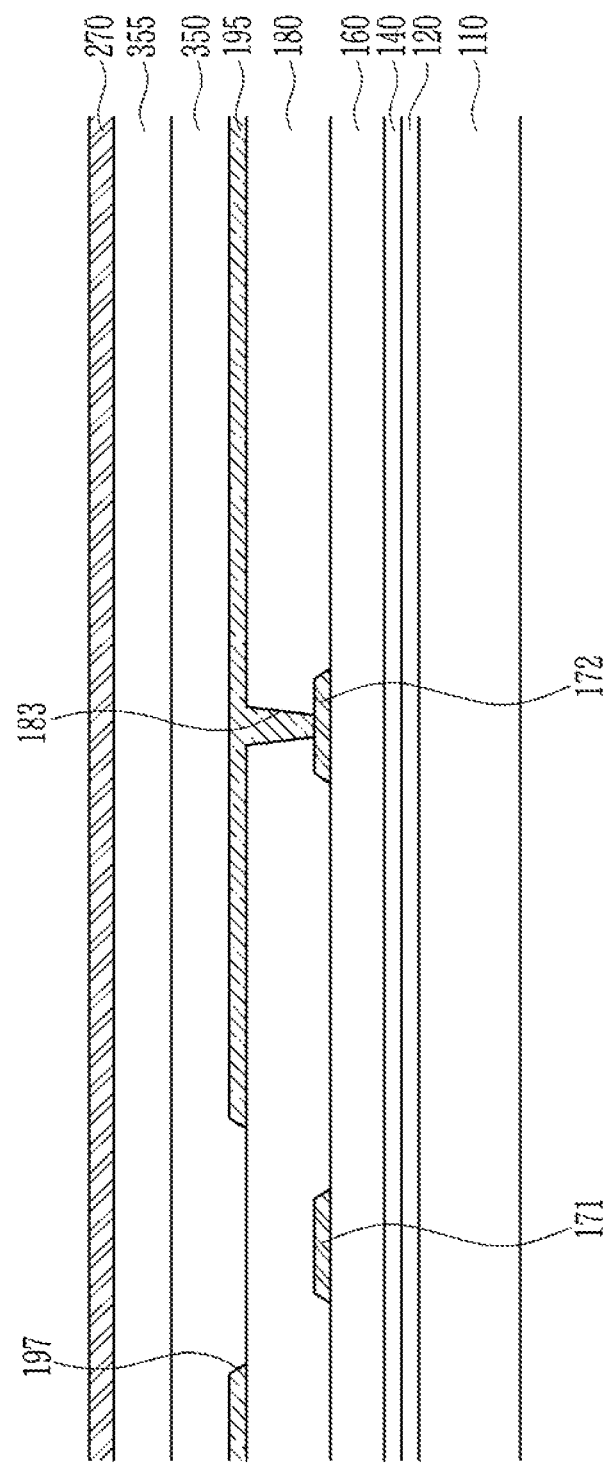
FIG. 6 is a cross-sectional view showing a dummy region of an organic light emitting diode display according to an exemplary embodiment of the present inventive concept.

In the organic light emitting diode display according to an exemplary embodiment shown in FIG. 5 and FIG. 6, a spacer 355 may be further formed on the pixel definition layer 350, which would be described in detail.

FIG. 5 is a cross-sectional view showing a display area of an organic light emitting diode display according to an exemplary embodiment, and FIG. 6 is a cross-sectional view showing a dummy region of an organic light emitting diode display according to an exemplary embodiment.

As shown in FIG. 5, the thin film transistor Qd, the pixel electrode 191, the organic emission layer 370, and the common electrode 270 may be positioned in the display area of the organic light emitting diode display according to an exemplary embodiment.

The pixel definition layer 350 may be positioned on the edge of the pixel electrode 191, and a spacer 355 may be positioned on the pixel definition layer 350. In one embodiment, the spacer 355 may be positioned between the pixel definition layer 350 and the common electrode 270. The spacer 355 may include the organic insulating material or the inorganic insulating material. Although not shown, an encapsulation substrate may be positioned on the common electrode 270, and the spacer 355 may have a function of maintaining an interval between the substrate 110 and the encapsulation substrate to prevent contact therebetween.

As shown in FIG. 6, the data line 171, the driving voltage line 172, the dummy electrode 195, and the common electrode 270 may be positioned in the dummy region of the organic light emitting diode display according to an exemplary embodiment of the present inventive concept.

The passivation layer 180 may be positioned between the driving voltage line 172 and the dummy electrode 195. The pixel definition layer 350 and the spacer 355 may be positioned between the dummy electrode 195 and the common electrode 270, for example, as shown in FIG. 6.

The dummy electrode 195 may be connected to the driving voltage line 172 to receive the predetermined driving voltage. A burn may be generated by a difference between the driving voltage applied to the dummy electrode 195 and the common voltage applied to the common electrode 270. In the present exemplary embodiment, adding the spacer 355 between the dummy electrode 195 and the common electrode 270 as well as the pixel definition layer 350 may increase the distance between the dummy electrode 195 and the common electrode 270 by the thickness of the spacer 355. Accordingly, the burn between the dummy electrode 195 and the common electrode 270 may be prevented.

While not shown, a burn between two electrodes may be prevented by controlling the forming process. For example, an end portion of the pixel electrode may be formed to be thicker and/or wider than other portions of the pixel electrode, which may shorten the distance between the pixel electrode and a nearby electrode. When a predetermined voltage is applied to these electrodes, the burn (dielectric breakdown) may occur. For preventing the dielectric breakdown, an insulating layer may be formed to cover at least the end portion of the pixel electrode to prevent the dielectric breakdown from occurring. For example, the insulating layer may include the pixel definition layer, and may include polyacrylate resin, a polyimide resin, a silica-based inorganic material, or silicon nitride. After the insulating layer is formed on the irregularly-formed end portion of the pixel electrode, other structural layers may be formed.

The organic light emitting diode display according to an exemplary embodiment will be described with reference to FIG. 7 and FIG. 8.

Figure 7:
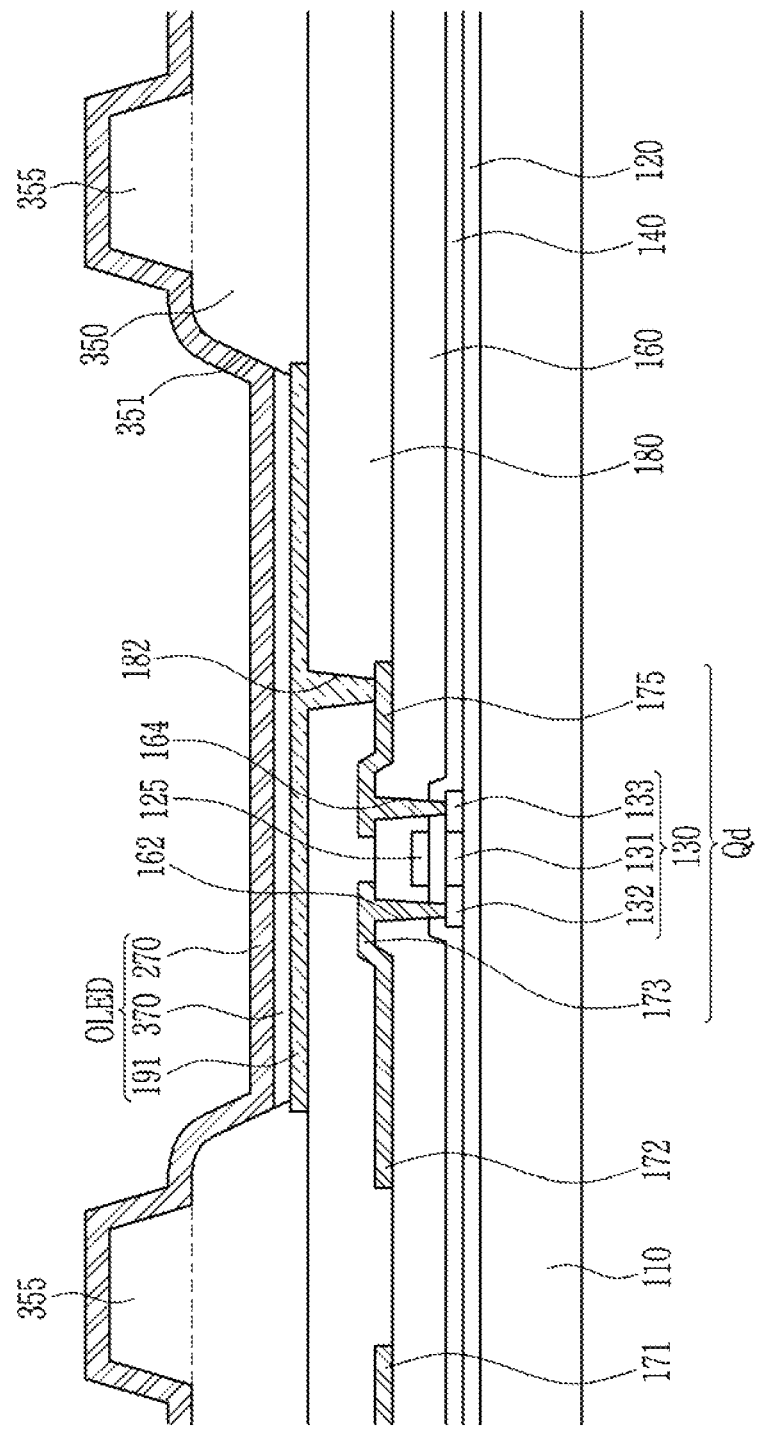
FIG. 7 is a cross-sectional view showing a display area of an organic light emitting diode display according to an exemplary embodiment of the present inventive concept.
Figure 8:
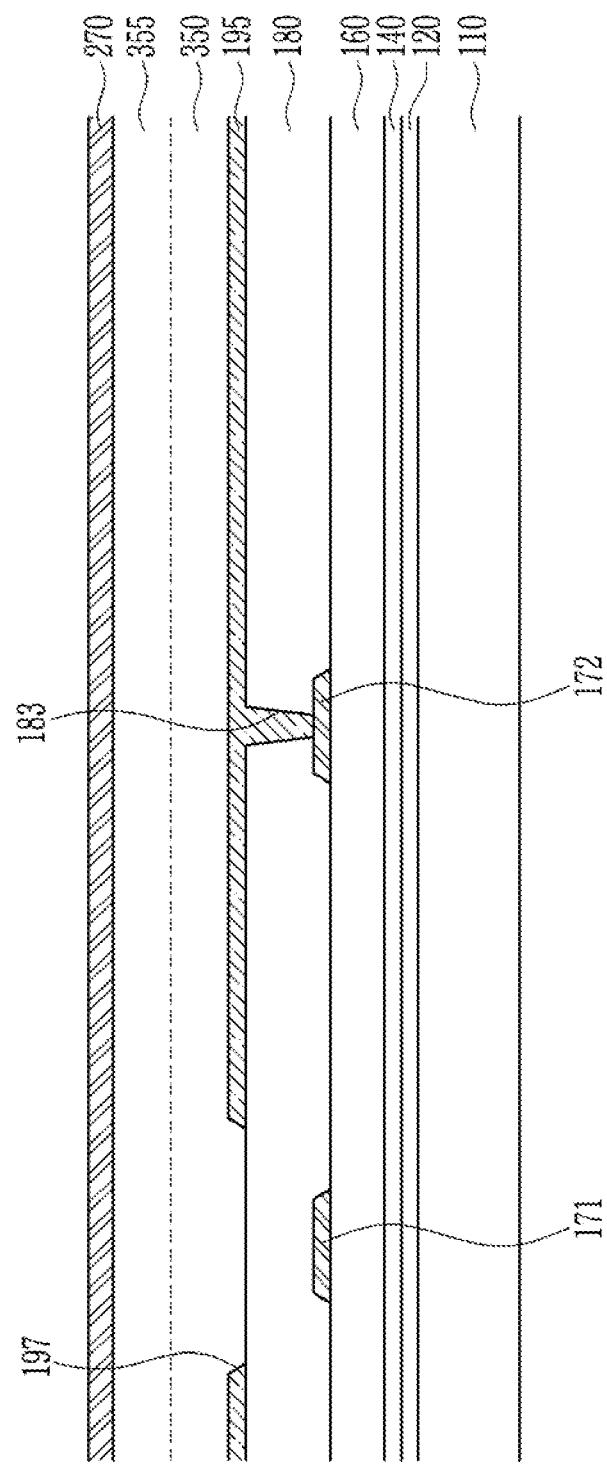
FIG. 8 is a cross-sectional view showing a dummy region of an organic light emitting diode display according to an exemplary embodiment of the present inventive concept.

In the organic light emitting diode display according to an exemplary embodiment shown in FIG. 7 and FIG. 8, the pixel definition layer 350 and the spacer 355 may be integrally made.

FIG. 7 is a cross-sectional view showing a display area of an organic light emitting diode display according to an exemplary embodiment, and FIG. 8 is a cross-sectional view showing a dummy region of an organic light emitting diode display according to an exemplary embodiment.

As shown in FIG. 7, the thin film transistor Qd, the pixel electrode 191, the organic emission layer 370, the common electrode 270, the pixel definition layer 350, and the spacer 355 may be positioned in the display area of the organic light emitting diode display according to an exemplary embodiment.

As shown in FIG. 8, the data line 171, the driving voltage line 172, the dummy electrode 195, the common electrode 270, the pixel definition layer 350, and the spacer 355 may be positioned in the dummy region of the organic light emitting diode display according to an exemplary embodiment.

In the previous exemplary embodiment, for example in FIG. 5, the spacer 355 may be separately formed from the pixel definition layer 350. However the pixel definition layer 350 and the spacer 355 may be integrally formed in the present exemplary embodiment. In one embodiment, the pixel definition layer 350 and the spacer 355 may be formed of the same material. In another embodiment, the pixel definition layer 350 and the spacer 355 may be simultaneously formed by one process. For example, a material layer having a thickness corresponding to a combined thickness of the pixel definition layer 350 and the spacer 355 may be formed, and may be patterned by using a slit mask or a halftone mask to simultaneously form the pixel definition layer 350 and the spacer 355. According to the present exemplary embodiment, an additional process for forming the spacer 355 may not be performed, and a manufacturing cost and manufacturing time may be reduced.

The foregoing is illustrative of exemplary embodiments of the present inventive concept and is not to be construed as limiting thereof. Although a few exemplary embodiments have been described, those skilled in the art will readily appreciate that many modifications are possible in the exemplary embodiments without material departing from the novel teachings of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An organic light emitting diode display comprising:
    a substrate including a display area, a driving circuit area, and a dummy region positioned between the display area and the driving circuit area;
    a first electrode positioned in the display area;
    a second electrode overlapping the first electrode and configured to receive a common voltage;
    an organic emission layer positioned between the first electrode and the second electrode;
    a driving voltage line positioned in the display area and the dummy region; and
    a dummy electrode positioned in the dummy region and connected to the driving voltage line and configured to receive a driving voltage,
    wherein the dummy electrode is positioned at the same layer as the first electrode, and
    wherein the dummy electrode and electrically insulated spaced apart from each other.

2. The organic light emitting diode display of claim 1, wherein
    the dummy electrode is made of the same material as the first electrode.

3. An organic light emitting diode display comprising:
    a substrate including a display area, a driving circuit are and a dummy region positioned between the display area and the driving circuit area;
    a first electrode positioned in the display area;
    a second electrode overlapping the first electrode;
    an organic emission layer positioned between the first electrode and the second electrode,
    a driving voltage line positioned in the display area and the dummy region;
    a dummy electrode positioned in the dummy region and connected to the driving voltage line, wherein the dummy electrode is positioned at the same layer as the first electrode; and
    a plurality of openings formed in the dummy electrode.

4. The organic light emitting diode display of claim 3, wherein
    the plurality of openings are disposed with a predetermined interval.

5. The organic light emitting diode display of claim 1, further comprising a pixel definition layer positioned between the dummy electrode and the second electrode.

6. The organic light emitting diode display of claim 5, wherein
    the pixel definition layer is further positioned between the first electrode and the second electrode.

7. The organic light emitting diode display of claim 6, wherein
    the pixel definition layer is formed on an edge portion of the first electrode.

8. The organic light emitting diode display of claim 5, wherein
    the pixel definition layer includes polyacrylate resin, a polyimide resin, a silica-based inorganic material, a silicon nitride.

9. The organic light emitting diode display of claim 5, further comprising
    a spacer positioned between the pixel definition layer and the second electrode.

10. The organic light emitting diode display of claim 9, wherein
    the spacer is positioned between the dummy electrode and the second electrode.

11. The organic light emitting diode display of claim 9, wherein
    the pixel definition layer and the spacer are integrally made.

12. The organic light emitting diode display of claim 1, further comprising
    a passivation layer positioned between the driving voltage line and the dummy electrode,
    the passivation layer has a contact hole formed to overlap the driving voltage line and the dummy electrode, and
    the dummy electrode is connected to the driving voltage line through the contact hole.

13. The organic light emitting diode display of claim 1, further comprising
    a driving circuit chip positioned in the driving circuit area.

* * * * *